(12) United States Patent
Moschiano et al.

(10) Patent No.: US 7,684,237 B2
(45) Date of Patent: Mar. 23, 2010

(54) READING NON-VOLATILE MULTILEVEL MEMORY CELLS

(75) Inventors: Violante Moschiano, Bacoli (IT); Giovanni Santin, Rieti (IT); Michele Incarnati, Gioia dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 176 days.

(21) Appl. No.: 12/038,704

(22) Filed: Feb. 27, 2008

(65) Prior Publication Data

US 2008/0285341 A1 Nov. 20, 2008

(51) Int. Cl.
*G11C 16/00* (2006.01)
(52) U.S. Cl. .............................. 365/185.02; 365/185.03
(58) Field of Classification Search ............. 365/185.02
See application file for complete search history.

(56) References Cited

U.S. PATENT DOCUMENTS

| | | | |
|---|---|---|---|
| 6,327,202 B1 | 12/2001 | Roohparvar | |
| 6,839,875 B2 | 1/2005 | Roohparvar | |
| 6,870,774 B2 | 3/2005 | Roohparvar et al. | |
| 7,139,196 B2 | 11/2006 | Tran | |
| 7,177,977 B2 | 2/2007 | Chen et al. | |
| 7,187,585 B2 | 3/2007 | Li et al. | |
| 7,196,946 B2* | 3/2007 | Chen et al. .............. | 365/189.07 |
| 7,372,730 B2* | 5/2008 | Chen ..................... | 365/185.02 |
| 2005/0172065 A1 | 8/2005 | Keays | |
| 2006/0083071 A1 | 4/2006 | Nagasyhima | |
| 2006/0203545 A1 | 9/2006 | Cernea | |
| 2006/0242485 A1 | 10/2006 | Roohparvar | |
| 2007/0014161 A1 | 1/2007 | Li et al. | |

* cited by examiner

*Primary Examiner*—Tan T. Nguyen
(74) *Attorney, Agent, or Firm*—Brooks, Cameron, & Huebsch, PLLC

(57) ABSTRACT

Embodiments of the present disclosure provide methods, devices, modules, and systems for reading non-volatile multilevel memory cells. One method includes receiving a request to read data stored in a first cell of a first word line, performing a read operation on an adjacent cell of a second word line in response to the request, determining whether the first cell is in a disturbed condition based on the read operation. The method includes reading data stored in the first cell in response to the read request by applying a read reference voltage to the first word line and adjusting a sensing parameter if the first cell is in the disturbed condition.

45 Claims, 8 Drawing Sheets

US 7,684,237 B2

READING NON-VOLATILE MULTILEVEL MEMORY CELLS

TECHNICAL FIELD

This application claims priority to Italian Patent Application Serial No. RM2007A000273, filed May 16, 2007, the specification of which is incorporated herein by reference The present disclosure relates generally to semiconductor devices and, more particularly, to memory devices having non-volatile multilevel memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged A NAND array architecture arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line.

Memory cells in a NAND array architecture can be configured, e.g., programmed, to a desired state. That is, electric charge can be placed on or removed from the floating gate of a memory cell to put the cell into a number of stored states. For example, a single level cell (SLC) can represent two binary states, e.g., 1 or 0. Flash memory cells can also store more than two binary states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can represent more than one bit. MLCs can have more than one programmed state, e.g., a cell capable of representing four bits can have fifteen programmed states and an erased state.

As NAND flash memory is scaled, parasitic capacitance coupling between adjacent memory cell floating gates becomes a problem. Floating gate-to-floating gate interference can cause a wider Vt distribution when the distribution should be tighter. The wider distributions can result in a degraded programming performance as well as other problems.

These problems for single level cell (SLC) NAND array are even greater in a multiple level cell (MLC) NAND array. MLC memory stores multiple bits on each cell by using different threshold levels for each state that is stored. The difference between adjacent threshold voltage distributions may be very small as compared to an SLC memory device. Therefore, the effects of floating gate-to-floating gate coupling in an MLC device are greatly increased.

DETAILED DESCRIPTION

Figure 1:
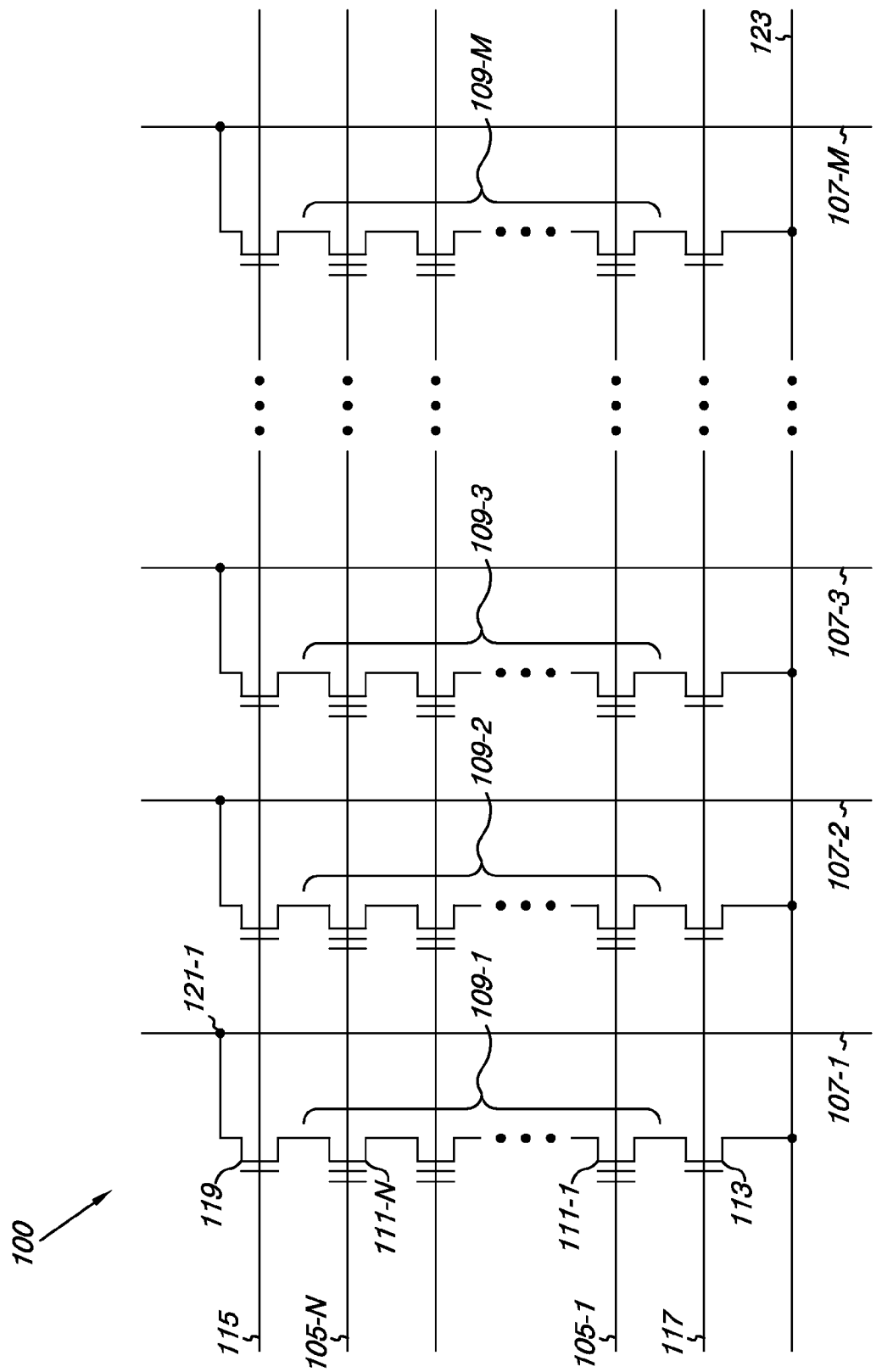
FIG. 1 is a schematic of a portion of a non-volatile memory array that can be used with embodiments of the present disclosure.

Embodiments of the present disclosure provide methods, devices, modules, and systems for reading non-volatile multilevel memory cells. Various embodiments can compensate for threshold voltage (Vt) shifts of memory cells caused by floating gate to floating gate (Fg-Fg) interference effects. Compensating for such Fg-Fg interference effects can reduce or prevent read errors. Embodiments of the present disclosure can compensate for Fg-Fg interference due to adjacent, e.g., neighboring, cells coupled to an adjacent word line or coupled to an adjacent bit line.

One method embodiment for reading memory cells in an array of non-volatile multilevel memory cells includes receiving a request to read data stored in a first cell of a first word line, performing a read operation on an adjacent cell of a second word line in response to the request, determining whether the first cell is in a disturbed condition based on the read operation. In various embodiments, determining whether the first cell is in a disturbed condition includes determining whether the Vt of the adjacent cell has increased since the programming of the first cell. The method includes reading data stored in the first cell in response to the read request by applying a read reference voltage to the first word line and adjusting a sensing parameter if the first cell is in the disturbed condition.

In various embodiments, the cell adjacent to the first cell can be on the same word line, e.g., the first cell can be an odd bit line cell and the adjacent cell can be an even bit line cell. In such embodiments, in response to a request to read data stored in the first cell, e.g., odd bit line cell, a read operation is performed on an adjacent cell coupled to the same word line, e.g., an adjacent even bit line cell.

The adjusted sensing parameter can be modified based on a determined data state of the adjacent cell. In various embodiments, adjusting the sensing parameter includes adjusting a precharge bit line voltage based on the read operation performed on the adjacent cell. In various embodiments, adjusting the sensing parameter includes adjusting a sensing time period based on the read operation performed on the adjacent cell.

In various embodiments, the same read reference voltage can be applied to the first word line to read data stored in the first cell whether or not the first cell is in the disturbed condition. That is, the same read reference voltage can be used to read data from the first cell whether or not the first cell has experienced Fg-Fg interference due to programming of an adjacent cell. In some embodiments, performing the read operation on the adjacent cell includes applying only one read reference voltage to the adjacent cell during the read operation. In such embodiments, the read reference voltage can be a voltage used to determine whether the adjacent cell is in an erase state or in one of a number of program states.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

FIG. 1 is a schematic of a portion of a non-volatile memory array 100 that can be used with embodiments of the present disclosure. The embodiment of FIG. 1 illustrates a NAND architecture non-volatile memory. However, embodiments described herein are not limited to this example. As shown in FIG. 1, the memory array 100 includes word lines 105-1, ..., 105-N and intersecting bit lines 107-1, ..., 107-M. For ease of addressing in the digital environment, the number of word lines 105-1, ..., 105-N and the number of bit lines 107-1, ..., 107-M are each some power of two, e.g., 256 word lines by 4,096 bit lines.

Memory array 100 includes NAND strings 109-1, ..., 109-M. Each NAND string includes non-volatile memory cells 111-1, ..., 111-N, each located at an intersection of a word line 105-1, ..., 105-N and a local bit line 107-1, ..., 107-M. The non-volatile memory cells 111-1, ..., 111-N of each NAND string 109-1, ..., 109-M are connected in series source to drain between a source select gate (SGS), e.g., a field-effect transistor (FET) 113, and a drain select gate (SGD), e.g., FET 119. Source select gate 113 is located at the intersection of a local bit line 107-1 and a source select line 117 while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In various embodiments, construction of non-volatile memory cells, 111-1, ..., 111-N, includes a source, a drain, a floating gate or charge storage layer, and a control gate. Non-volatile memory cells, 111-1, ..., 111-N, have their control gates coupled to a word line, 105-1, ..., 105-N respectively. A column of the non-volatile memory cells, 111-1, ..., 111-N, make up the NAND strings, e.g., 109-1, ..., 109-M, coupled to a given local bit line, e.g., 107-1, ..., 107-M respectively. A row of the non-volatile memory cells are commonly coupled to a given word line, e.g., 105-1, ..., 105-N. An AND array architecture would be similarly laid out except that the string of memory cells would be coupled in parallel between the select gates.

Figure 5:
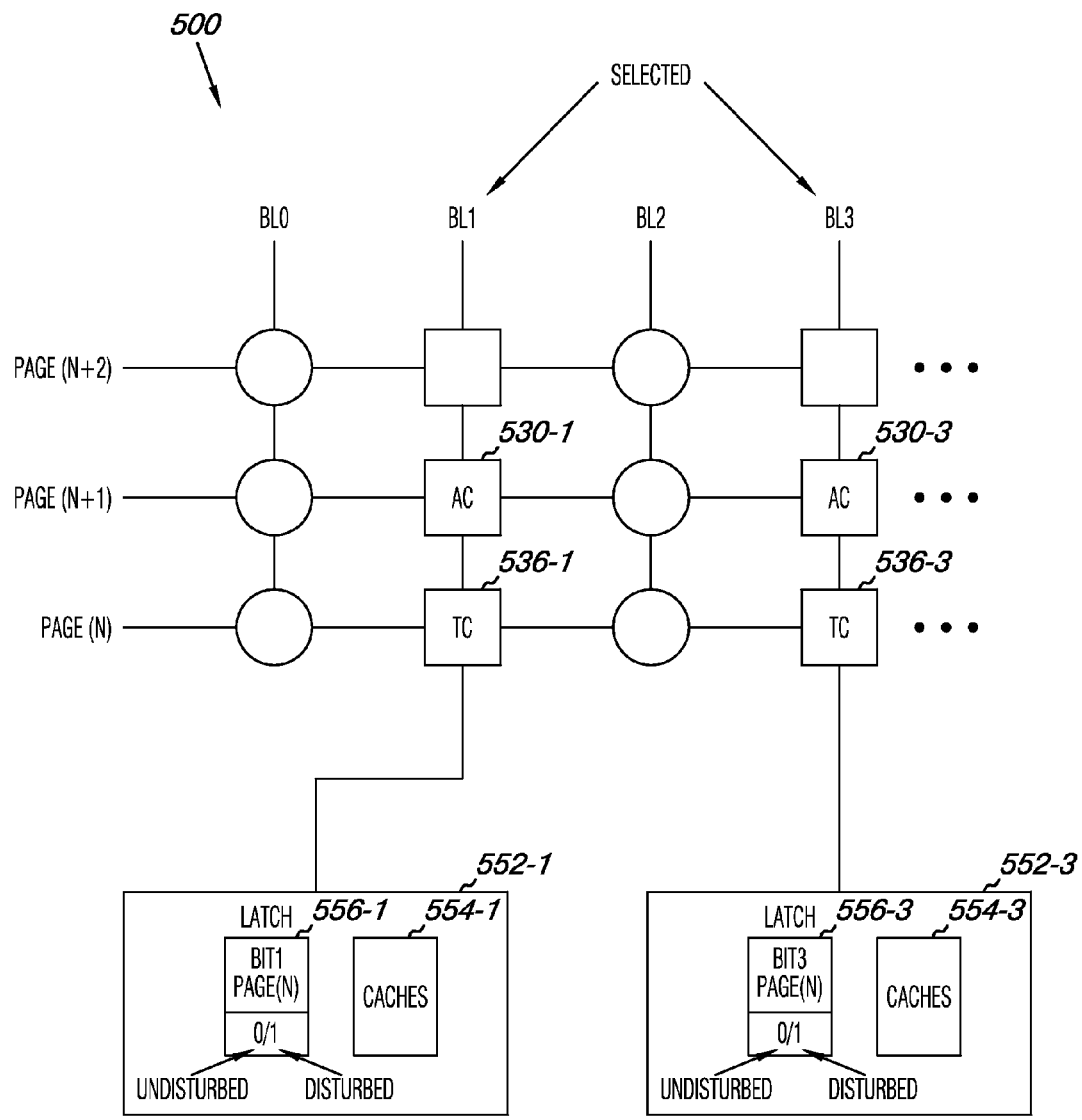
FIG. 5 is diagram of a portion of a memory array including memory cells that can be read according to embodiments of the present disclosure.

Although not shown in FIG. 1, as one of ordinary skill in the art will appreciate, and as described further herein, the array 100 is coupled to various circuitry for writing data to and reading data from the memory cells. For example, as shown in FIG. 5, the bit lines, e.g., 107-1 to 107-M, are coupled to sensing circuitry, e.g., 552-1 and 552-3 shown in FIG. 5, which can be used to determine data stored in selected memory cells 111-1 to 111-N.

Figure 2A:
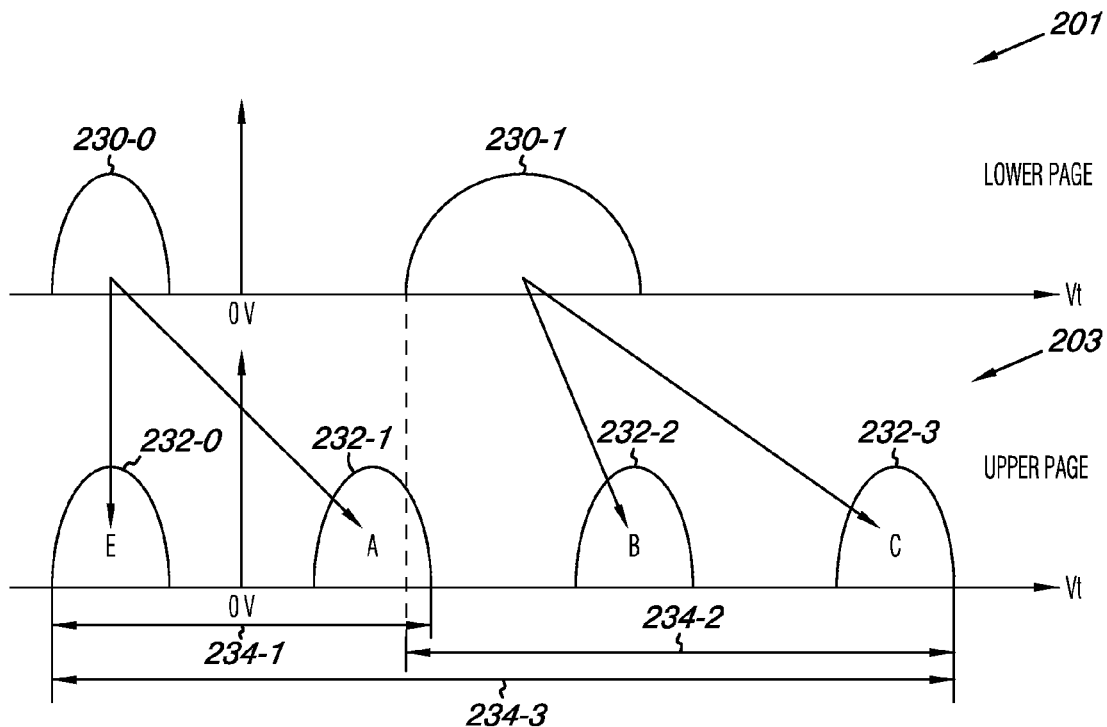
FIG. 2A illustrates a prior art programming method for reducing floating gate to floating gate interference.
Figure 2B:
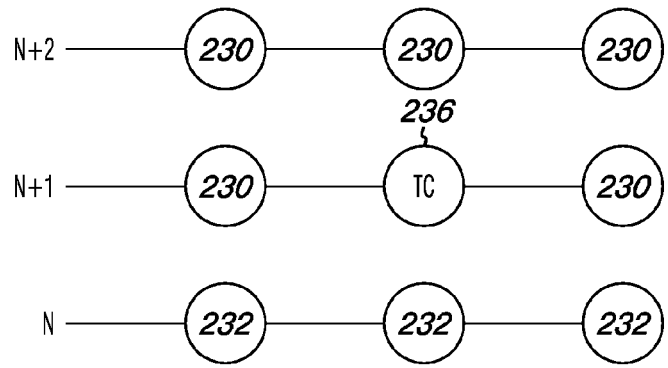
FIG. 2B illustrates a number of memory cells programmed according to the method illustrated in FIG. 2A.

FIG. 2A illustrates a prior art programming method for reducing floating gate to floating gate interference, and FIG. 2B illustrates a number of memory cells programmed according to the method illustrated in FIG. 2A. In FIG. 2A, graph 201 illustrates Vt distributions 230-0 and 230-1 for cells after a lower page programming process, while graph 203 illustrates the Vt distributions 232-0, 232-1, 232-1, and 232-3 after an upper pace programming process. As one of ordinary skill in the art will appreciate, multilevel memory cells can have multiple logical pages associated therewith which can be programmed in multiple programming passes, e.g., the pages can be programmed at different times. The number of logical pages can depend on the number of bits stored by the cells.

The method shown in FIG. 2A is for non-volatile multi-level memory cells storing two bits of data. As such, the cells are programmed to one of for data states, e.g., E, A, B, or C as shown, after both the lower page and upper pages have been programmed. That is, in the method shown in FIG. 2, each memory cell is assumed to be a two-bit MLC. However, embodiments of the present disclosure are not limited to MLCs representing 2 bits/cell, e.g., in some embodiments the MLCs may represent more or fewer than 2 bits/cell.

In the method shown in FIG. 2A, cells within distribution 230-0 after their lower page is programmed are programmed to either distribution 232-0 (state E) or to distribution 232-1 (state A) corresponding to Vt shift 234-1, e.g., the maximum Vt shift amount for cells programmed to state E or A from distribution 230-0, e.g., an erase state. In the method shown in FIG. 2A, cells within distribution 230-1 after their lower page is programmed are programmed to either distribution 232-2 (state B) or to distribution 232-3 (state C) corresponding to Vt shift 234-2, e.g., the maximum Vt shift amount for cells programmed to state B or C from distribution 230-1.

FIG. 2A also illustrates a Vt shift amount 234-3 corresponding to what the maximum Vt shift amount of the cells would be if they were programmed according to a different method in which the cells were programmed from distribution 230-0, e.g., the erase state, to the uppermost program state C, e.g., 232-3. As described further below in connection with FIG. 2B, the Vt shift amounts associated with programming memory cells influences Fg-Fg interference effects experienced by previously programmed adjacent cells. For instance, the more the Vt of a cell being programmed shifts, the greater the Fg-Fg effect on an adjacent cell.

Programming the logical pages associated with multilevel memory cells at different times and/or in different sequences has also been used to reduce Fg-Fg interference effects. For instance, FIG. 2B illustrates a number of memory cells adjacent to a target cell (TC) 236. Target cell 236 is coupled to word line N+1, which is adjacent to word lines N and N+2. In FIG. 2B, the memory cells 232 on word line N are programmed to a final state, e.g., cells 232 do not receive further programming to shift their Vt levels. Memory cells programmed to a final state refers to cells having each of their logical pages programmed. For instance, for two-bit multilevel cells, the cells 232 would have both their upper pages and lower pages programmed. If the cells were four-bit cells having four associated logical pages, then such cells would be in a final state when all four logical pages had been programmed.

In FIG. 2B, the cells 230 adjacent to cell 236 on word line N+1 and N+2 have their associated lower pages programmed, e.g., they are in distribution 230-0 or 230-1 shown in FIG. 2A. Memory cell 236 represents a cell programmed to a final state, e.g., a cell programmed to state E, A, B, or C shown in FIG. 2A. Since the cells 232 are programmed to a final state, their Vt levels will not be shifted by further programming pulses, which prevents cells 232 from shifting the programmed Vt level of target cell 236 due to Fg-Fg interference. Since the lower pages of cells 230 have been programmed, their Vt levels will be shifted by, at most, shift amount 234-1 or 234-2 shown in FIG. 2A. Thus, programming the memory cells of FIG. 2B according to the method shown in FIG. 2A reduces the Fg-Fg interference effect experienced by programmed target cell 236 by preventing the adjacent cells 230 from experiencing shift amount 234-3 due to programming the cells from an erase state, e.g., 230-0, to an uppermost program state 232-3.

As one of ordinary skill in the art will appreciate, various encoding schemes and/or programming algorithms can be used to reduce Fg-Fg interference. Embodiments of the present disclosure for reading non-volatile multilevel memory cells can be applied to memory cells programmed according various algorithms and are not limited a particular programming process or encoding scheme such as that described in connection with FIGS. 2A and 2B.

Figure 3A:
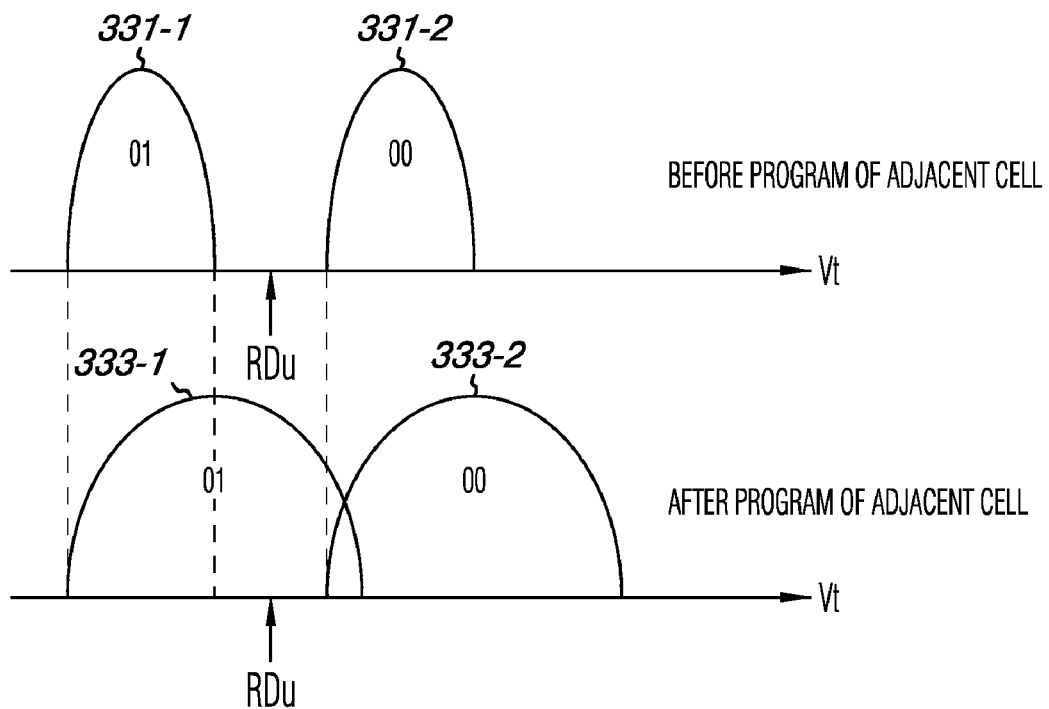
FIG. 3A illustrates a diagram of Vt distributions associated with memory cells before and after floating gate to floating gate interference due to programming of adjacent memory cells.
Figure 3B:
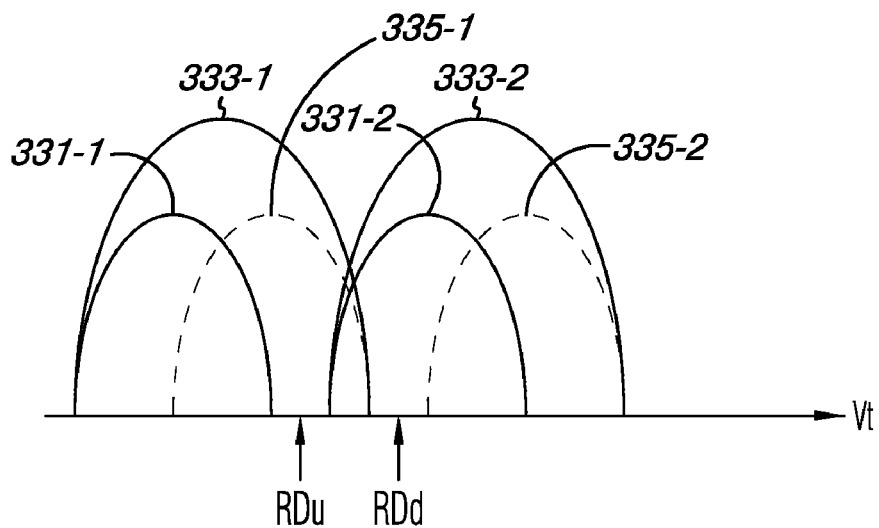
FIG. 3B illustrates the Vt distributions of FIG. 3A including disturbed and undisturbed Vt distribution components.

FIG. 3A illustrates a diagram of Vt distributions associated with memory cells before (upper graph) and after (lower graph) floating gate to floating gate interference due to programming of adjacent memory cells. FIG. 3B illustrates the Vt distributions of FIG. 3A including disturbed and undisturbed Vt distribution components.

The example illustrated in FIG. 3A shows two adjacent program distributions 331-1 and 331-2 associated with memory cells before an adjacent memory cell has been programmed, e.g., prior to Fg-Fg interference. In this example, distribution 331-1 represents cells storing logical data "01", e.g., "1" is stored in its lower page and "0" is stored in its upper page. Distribution 331-2 represents cells storing logical data "00", e.g., "0" is stored in its lower page and its upper page. As described above, the lower and upper pages associated with non-volatile multilevel memory cells can be separately programmed, e.g., programmed at different times. Also, a read operation on a cell having multiple associated pages can include reading one of the pages, e.g., the upper page or lower page.

The example illustrated in FIG. 3A also includes a read reference voltage RDu. Read reference voltage RDu can be applied to the word line of a selected cell during a read operation in order to determine if the cell stores data "01" or "00," e.g., to distinguish between the data states by determining whether the Vt of the selected cell is above or below the RDu level. As one of ordinary skill in the art will appreciate, non-volatile multilevel memory cells can have a set of, e.g., a number of, associated read reference voltages having values between adjacent program states, which can be used to determine the actual data state of the cell during a read operation.

The Vt distributions 333-1 and 333-2 shown in FIG. 3A illustrate Vt distributions 331-1 and 332-1, respectively, after experiencing a Vt shift corresponding to Fg-Fg interference caused by programming of an adjacent memory cell, e.g., a memory cell on a neighboring word line. That is, Vt distributions 333-1 and 333-2 represent the total Vt distributions for memory cells that have and have not experienced Fg-Fg interference due to adjacent cell programming.

As shown in the lower graph of FIG. 3A, the Fg-Fg interference can cause an overlap of the Vt distributions 333-1 and 333-2 such that the read reference voltage RDu can no longer be used to accurately distinguish between the two data states "01" and "00." That is, some cells programmed to within distribution 331-1 may have been disturbed, e.g., experienced a Vt shift upward, due to adjacent cell programming such that using RDu to read data from cells programmed to "01" may result in the cell being read as storing incorrect data, e.g., "00" instead of "01."

FIG. 3B illustrates the total Vt distributions 333-1 and 333-2 of FIG. 3A including the disturbed and undisturbed Vt distribution components. In the example of FIG. 3B, the Vt distributions 331-1 and 331-2 are adjacent program states, e.g., "01" and "00" in this example, which have not been disturbed, e.g., have not experienced a Vt shift due to adjacent memory cell programming. The Vt distributions 335-1 and 335-2 represent disturbed distributions. That is, distributions 335-1 and 335-2 represent an upward Vt shift of the cells which were programmed to a data state 331-1 and 331-2, respectively.

For instance, consider a number of cells of a selected word line, some of which have been programmed to data state 331-1 ("01") and some of which have been programmed to data state 331-2 ("00"). Subsequent to programming the cells of the selected word line, a number of cells adjacent to the cells of the selected word line, e.g., cells of an adjacent word line that share a bit line, experience programming. Some of the adjacent cells will have an increased Vt level due to the subsequent programming and will disturb the programmed cells of the selected word line, e.g., the altered Vt levels of the adjacent cells will cause a Vt level increase of the selected word line cells such that those selected word line cells belong to disturbed Vt distributions 335-1 and 335-2.

On the other hand, adjacent cells which do not have an increased Vt level due to the subsequent programming will not disturb the programmed cells of the selected word line, such that those cells belong to Vt undisturbed distributions 331-1 and 331-2. As such, in this example, the programmed memory cells of the selected word line will belong to either undisturbed distributions 331-1 and 331-2 or to disturbed distributions 335-1 and 335-2, depending on the Vt level shifts experienced by the subsequently programmed adjacent cells. As shown in FIG. 3B, read reference voltage RDu can be used to read undisturbed cells, e.g., to distinguish between cells within distribution 331-1 and 331-2. Read reference voltage RDd can be used to read the disturbed cells, e.g., to distinguish between cells within distribution 335-1 and 335-2.

Therefore, performing a read operation on an adjacent cell, e.g., a neighboring cell coupled to an adjacent word line and sharing a bit line with a target cell to be read or a neighboring cell coupled to a bit line adjacent to the target cell's bit line, can be used to determine whether the target cell belongs to a disturbed distribution, e.g., 335-1 and 335-2, or to an undisturbed distribution, e.g., 331-1 and 331-2. The read of the adjacent cell can be used to determine whether the adjacent cell has experienced a Vt shift subsequent to programming of the target cell to a final state.

As such, in various embodiments of the present disclosure, a read operation is performed on a cell adjacent to a target cell in response to a request to read data stored in the target cell. That is, when a request to read data from a target cell is received, a read of an adjacent cell is first performed. In such embodiments, the read of the adjacent cell is used to determine a sensing parameter to be used to read the target cell.

In various embodiments, and as described in greater detail in connection with FIGS. 4-6, reading data stored in a target cell in response to a read request includes applying a read reference voltage to the word line of the target cell and adjusting a sensing parameter if the target cell is determined to be in a disturbed condition based on a read operation performed on an adjacent cell. In various embodiments, adjusting a sensing parameter such as a precharge bit line voltage or a bit line sensing period can compensate for Fg-Fg interference and can reduce or prevent erroneous data reads.

Figure 4A:
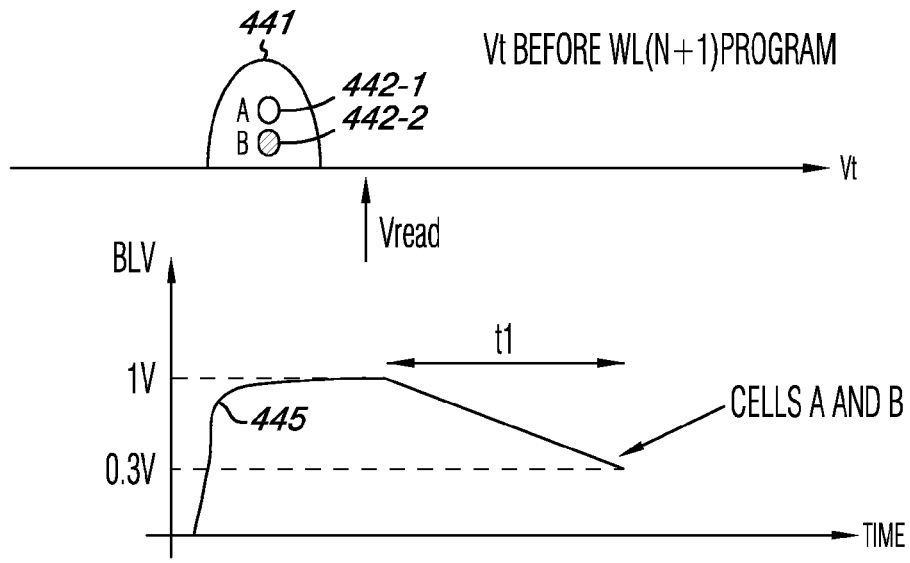
FIG. 4A illustrates a graph associated with reading data from memory cells prior to the cells experiencing floating gate to floating gate interference.

FIG. 4A illustrates a graph associated with reading data from memory cells of a selected word line, e.g., WL(N), prior to the cells experiencing floating gate to floating gate interference, e.g., prior to the cells' Vt levels experiencing a shift due to subsequent programming of adjacent cells on an adjacent word line, e.g., WL(N+1). The embodiment illustrated in FIG. 4A shows two memory cells, e.g., cell A 442-1 and cell B 442-2, having Vt levels within Vt distribution 441. The distribution 441 represents a particular program state, e.g., "01", "00", "10", or "11", to which cells 442-1 and 442-2 have been programmed. The cells 442-1 and 442-2 are cells of a selected word line that can be programmed and read at the same time. For instance, cells 442-1 and 442-2 can be cells corresponding to a particular page of data. In some embodiments, the cells 442-1 and 442-2 can both be associated with an even bit line or an odd bit line, e.g., an even page or an odd page of data.

During a read operation, a read reference voltage Vread is applied to the selected word line, e.g., to the control gate of cells 442-1 and 442-2, while a pass through voltage is applied to unselected word lines such that the unselected word line cells are turned "on," e.g., in a conducting state. If the read reference voltage Vread applied to the control gates is greater than the Vt level of the memory cells, then the cell will turn "on" and conduct current between its source and drain. If Vread is less than the Vt level of the cell, then the cell will be "off" and will not conduct current or will conduct less current than when the cell is "on." In various embodiments, the voltage level of a bit line can be sensed by a sensing module coupled to the bit line, e.g., sensing module 552-1 or 552-3 shown in FIG. 5.

In various embodiments, the bit lines associated with cells being read, e.g., cells 442-1 and 442-2, are precharged to a particular precharge voltage level, e.g., precharge voltage level 445. In this example, the precharge voltage level 445 is 1.0V. However, embodiments of the present disclosure are not limited to a particular precharge bit line voltage. In such embodiments, the voltage level of the bit line decreases as current flows between source and drain depending on the reference read voltage applied to the selected word line. In various embodiments, the state of a cell being read can be determined based on whether the bit line voltage discharges by a predetermined amount during a predetermined bit line sensing period, or based on whether the bit line voltage reaches a predetermined threshold value during the predetermined sensing period.

For example, in the embodiments shown in FIGS. 4A-4D, a memory cell 442-1/442-2 is considered to be "off", e.g., in state 441, if the bit line voltage BLV discharges more than 500 mV, e.g., if the BLV decreases by more than 500 mV from the 1.0V precharge voltage 445, during bit line sensing period t1. If the BLV discharges less than 500 mV during sensing period t1, then the cell is considered to be "on," e.g., not in state 441. In various embodiments, the sensing period t1 can be about 5 microseconds. However, the sensing period t1 time can depend on various factors and embodiments of the present disclosure are not limited to a particular bit line sensing period.

As shown in the embodiment illustrated in FIG. 4A, the bit line voltage for cell 442-1 and 442-2 both discharge by more than the predetermined amount, e.g., 500 mV, during sensing period t1. In this example, the BLV discharges by 700 mV, e.g., from the 1.0V precharge voltage 445 to 0.3V, during sensing period t1. That is, prior to programming of cells on a word line adjacent to the selected word line, both cells 442-1 and 442-2 are determined to be in the correct program state 441, e.g., the state to which cells 442-1 and 442-1 were programmed, during the data read.

Figure 4B:
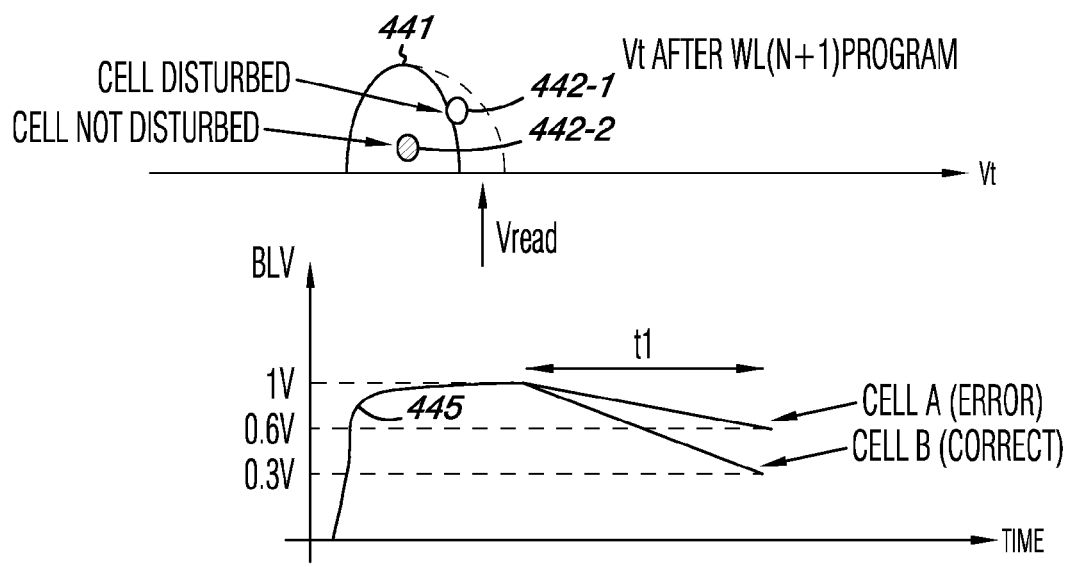
FIG. 4B illustrates a graph associated with reading data from memory cells after the cells have experienced floating gate to floating gate interference.

FIG. 4B illustrates a graph associated with reading data from memory cells of a selected word line, e.g., WL(N) after the cells have experienced floating gate to floating gate interference, e.g., after adjacent cells of an adjacent word line, e.g., WL(N+1), have experienced subsequent programming that can affect the Vt levels of the cells being read. The embodiment illustrated in FIG. 4B shows the two programmed memory cells 442-1 and 442-2 of FIG. 4A, after cells adjacent to cells 442-1 and 442-2 have experienced programming, e.g., the adjacent cells were programmed subsequent to cells 442-1 and 442-2.

In the example shown in FIG. 4B, cell 442-1 represents a disturbed cell and cell 442-2 represents an undisturbed cell. That is, as shown in FIG. 4B, the Vt level of cell 442-1 has been shifted upward due to Fg-Fg interference due to programming of a cell on an adjacent word line, e.g., WL(N+1), while the Vt level of cell 442-2 is unaffected by the subsequent programming of the adjacent word line cell. That is, as shown in the graph of FIG. 4B, after the adjacent cells on WL(N+1) are programmed, reading cell A 442-1 using Vread results in a read error. That is, in this example, reading cell A at Vread results in the bit line voltage BLV corresponding to cell A 442-1 discharging by 400 mV, e.g., from the 1.0V precharge BLV 445 to 0.6V, during sensing period t1. A read error results because the BLV associated with cell A discharges by less than the predetermined amount, e.g., 500 mV in this example, during t1. The 400 mV discharge of the cell A bit line during t1 indicates that cell A is "off" such that a sensing module coupled to the cell A bit line would determine cell A to not be in the 441 state to which cell A was programmed.

On the other hand, the BLV associated with the undisturbed cell, e.g., cell B 442-2, discharges by more than 500 mV, e.g., by 700 mV in this case, in response to the applied read reference voltage Vread. That is, the BLV associated with cell B after sensing period t1 indicates that cell B is "on" such that a sensing module would determine cell B to be in the 441 state, e.g., the correct state to which cell B was programmed.

As one of ordinary skill in the art will appreciate, and as described above, the amount of Fg-Fg interference, e.g., the Vt level shift amount, experienced by a target cell, e.g., a cell on WL(N), can depend on the data state to which the adjacent cell, e.g., the adjacent cell on WL(N+1), was programmed. For instance, if the adjacent cells on WL(N+1) are programmed according to the method shown in FIG. 2A such that the WL(N+1) cells are in data state E, A, B, or C, then the Fg-Fg interference experienced by cells on WL(N) will be different depending on the differing Vt shift amounts 234-1, 234-2, 234-3 of the WL(N+1) cells.

Various embodiments of the present disclosure can reduce or prevent errors associated with reading memory cells of a first word line, e.g., WL(N) by compensating for Fg-Fg interference effects caused by programming of adjacent cells of an adjacent word line, e.g., WL(N+1). For instance, as described further below in connection with FIGS. 4C and 4D, in various embodiments, a sensing parameter, used to read cells A and B shown in FIGS. 4A and 4B, can be adjusted based on a read operation performed on cells of an adjacent word line WL(N+1).

In various embodiments, the adjusted sensing parameter can be an adjusted precharge bit line voltage and/or an adjusted bit line sensing period. In such embodiments, and as described further in connection with FIGS. 4C and 4D, using the adjusted sensing parameter can compensate for Fg-Fg interference effects by reading the disturbed cell as though it has an undisturbed Vt level, e.g., as though the Vt level of the disturbed cell is lower than the cell's actual Vt level. In such embodiments, an unadjusted sensing parameter is used to read data from cells determined to be in an undisturbed condition based on the read operation performed on the adjacent word line cell.

In various embodiments, in response to a request to read data from a target cell of WL(N), a read operation is performed on a cell of WL(N+1) adjacent to the target cell in order to compensate for possible Fg-Fg interference effects of the WL(N+1) cell on the programmed state of the WL(N) target cell. In some embodiments, the read performed on the adjacent cell of WL(N+1) includes determining the actual data stored in the adjacent cell, e.g., the adjacent cell's programmed data state. In such embodiments, multiple read operations using different read reference voltages applied to WL(N+1) may be performed to determine a particular data state of the adjacent cell. The determined WL(N+1) data can be stored in a cache, e.g., cache 554-1/554-3 shown in FIG. 5. Each of the programmed data states of the adjacent cell of WL(N+1) can have a different Fg-Fg interference effect on the Vt level of the target cell of WL(N), e.g., depending on the encoding scheme or programming algorithm, etc.

Therefore, in various embodiments, not all of the data states to which the adjacent cell can be programmed are states for which Fg-Fg interference is compensated. That is, in various embodiments, an adjusted sensing parameter, e.g., an adjusted precharge bit line voltage, is only used to read a target cell of WL(N) if the data state determined by the read of the adjacent WL(N+1) cell is a state having an associated Vt shift amount, e.g., 234-1, 234-2, or 234-3 shown in FIG. 2A, at or above a certain threshold value, e.g., 1.5V, 2.0V, or 2.5V, among other values. In such embodiments, an adjusted precharge voltage used to read a disturbed target WL(N) cell can be modified based on the determined data of the WL(N+1) cell and/or based on the Vt shift amount associated therewith. That is, different adjusted precharge bit line voltages, e.g., 0.4V, 0.6V, 0.8V, may be used to read a disturbed target WL(N) cell, depending on the particular state or Vt level of the adjacent WL(N+1) cell.

In some embodiments, the read operation performed on the adjacent cell of WL(N+1) does not involve determining the actual data stored in the adjacent cell. For instance, in some embodiments, the read of the WL(N+1) cell includes using a single read reference voltage to determine whether the WL(N+1) cell has a Vt level above or below the particular read reference voltage value. As one example, in some embodiments, the read operation performed on the WL(N+1) cell is performed using a single read reference voltage to determine whether the WL(N+1) cell is in an erase state. In such embodiments, the read reference voltage can be 0V or another voltage, e.g., 0.1V, 0.5, among other read reference voltages that can be used to distinguish between an erase state and one or more program states.

An indication of whether the WL(N+1) cell is in the erase state can be stored in a data latch associated with the corresponding bit line of the WL(N+1) cell. For instance, the data latch can store a logic low, e.g., "0," if the WL(N+1) cell is in the erase state and a logic high, e.g., "1," if the WL(N+1) is in a state other than the erase state, e.g., state A, B, or C.

In such embodiments, the sensing circuitry, e.g., sensing module 552-1/552-3 shown in FIG. 5, associated with the bit line corresponding to the target cell of word line WL(N) can check the data latch during a data read performed on the target cell. A first sensing parameter can be used to read data from the target cell of WL(N) if the data latch stores a logic "0", e.g., the adjacent cell of WL(N+1) is in the erase state. A different sensing parameter can be used to read data from the target cell of WL(N) if the data latch stores a logic "1", e.g., the adjacent cell of WL(N+1) is not in the erase state. In such embodiments, the cell can be determined to be in an undisturbed condition if the data latch stores a logic "0" and can be determined to be in a disturbed condition if the data latch stores a logic "1." That is, the adjacent cell of WL(N+1) can be assumed to not have affected the target WL(N) cell if the WL(N+1) cell is in the erase state since its Vt level has not shifted from the erase Vt level during programming.

Figure 4C:
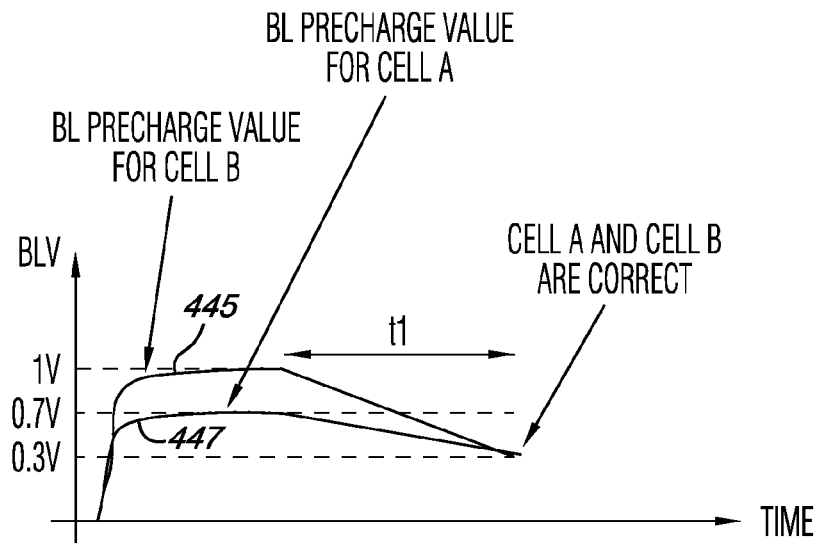
FIG. 4C illustrates a graph associated with reading data from memory cells by using an adjusted sensing parameter based on a read of adjacent memory cells according to an embodiment of the present disclosure.

As an example, and as shown in FIG. 4C, a first precharge bit line voltage, e.g., 1.0V, can be used to read data from the target cell of WL(N) if the data latch stores a logic "0," and a different precharge bit line voltage, e.g., an adjusted precharge bit line voltage can be used to read data from the target cell of WL(N) if the data latch stores a logic "1." In such embodiments, the same read reference voltage can be used to read the target cell data whether the data latch stores a "0" or a "1." That is, the same voltage, e.g., Vread as shown in FIGS. 4A and 4B, can be applied to the target word line WL(N) whether or not the target cell is determined to be in a disturbed condition. In this manner, the target cell data can be determined without having to apply multiple read reference voltages to the target word line WL(N).

FIG. 4C illustrates a graph associated with reading data from memory cells by using an adjusted sensing parameter based on a read of adjacent memory cells according to an embodiment of the present disclosure. The graph shown in the embodiment of FIG. 4C illustrates a first precharge bit line voltage 445 used to read memory cell 442-2 shown in FIGS.

4A and 4B, e.g., a memory cell on a selected word line such as WL(N) programmed to data state 441 and determined to be in an undisturbed condition based on a read operation performed on an adjacent cell of word line WL(N+1). The graph shown in the embodiment of FIG. 4C also illustrates a different precharge bit line voltage 447, e.g., an adjusted precharge bit line voltage, used to read memory cell 442-1 shown in FIGS. 4A and 4B, e.g., a memory cell on selected word WL(N) programmed to data state 441 and determined to be in a disturbed condition based on a read operation performed on the adjacent cell of word line WL(N+1).

As mentioned above and described further in connection with FIG. 5, a disturb status indicator can be stored in a data latch associated with the bit line of the target WL(N) memory cell and the adjacent WL(N+1) cell based on the read operation performed on the WL(N+1) cell. For instance, a logic "1" can be stored in the data latch to indicate that the Vt level of the adjacent cell of WL(N+1) has shifted, subsequent to the programming of the target cell of WL(N), by an amount sufficient to place the target cell in a disturbed condition. In such cases, a logic "0" can be stored in the data latch to indicate that the Vt level of the adjacent cell of WL(N+1) has not shifted, subsequent to the programming of the target cell of WL(N), by an amount sufficient to place the target cell in a disturbed condition. In such embodiments, the disturb status indicator stored in the data latch can be checked to determine whether or not an adjusted sensing parameter, e.g., an adjusted precharge bit line voltage and/or adjusted bit line sensing period, is used to read the target cell of WL(N).

The graph shown in the embodiment of FIG. 4C illustrates a method for reading data stored in memory cells, e.g., 442-1 and 442-2, that have been programmed to the same data state, e.g., 441, but may have experienced different Fg-Fg interference effects due to subsequent programming of adjacent memory cells. The method shown in FIG. 4C illustrates compensating for the Fg-Fg interference effects experienced by programmed cell A 442-1 such that both cell A 442-1, e.g., a disturbed cell, and cell 442-2, e.g., an undisturbed cell, are read correctly based on a particular applied reference read voltage, e.g., Vread as shown in FIGS. 4A and 4B.

In the embodiment of FIG. 4C, an adjusted precharge bit line voltage 447 is used to read disturbed cell 442-1 in order to compensate for the Vt shift amount experienced by cell 442-1 due to Fg-Fg interference. In the embodiment of FIG. 4C, using adjusted precharge bit line voltage 447, e.g., 0.7V in this example, results in sensing circuitry coupled to the corresponding bit line determining that cell 442-1 turned "off" in response to the application of Vread to word line WL(N), e.g., to the control gate of cell 442-1, during sensing period t1. That is, in FIG. 4C, cell A 442-1 is determined to have a Vt level less than Vread, e.g., a Vt level corresponding to data state 441 shown in FIG. 4B, rather than being determined to have a Vt level greater than Vread, e.g., a Vt level corresponding to a data state other than 441, resulting in a read error as shown in FIG. 4B.

As described above in connection with FIG. 4B, using the same precharge bit line voltage 445, e.g., 1.0V, to read both disturbed cell A 442-1 and undisturbed cell B 442-2, results in the bit line associated with the disturbed cell A being discharged by less than the threshold amount, e.g., by less than 500 mV in the example of FIG. 4B, during sensing period t1 due to the increased Vt level of the disturbed cell A. As shown in FIG. 4C, using a reduced precharge bit line voltage 447, e.g., 0.7V in the example, to read disturbed cell A 442-1 can compensate for the increased Vt level of cell A due to Fg-Fg interference by causing the bit line voltage to discharge to the same level, e.g., 0.3V as shown, for disturbed cell A 442-1 and for undisturbed cell B 442-2.

In the embodiment illustrated in FIG. 4C, a single strobe, e.g., a single sensing operation, can be used to read disturbed cells, e.g., cell A 442-1, and undisturbed cells, e.g., cell B 442-2, on a selected word line, e.g., WL(N). For instance, a single read operation using a particular read reference voltage, e.g., Vread, applied to the selected word line WL(N), and a particular sensing period, e.g., t1, can be used to read the disturbed and undisturbed cells programmed to a particular data state, e.g., 441 as shown in FIG. 4B. During the single strobe, the WL(N) cells determined to be in the undisturbed condition based on a read of adjacent WL(N+1) cells have their corresponding bit lines precharged to the unadjusted precharge bit line voltage 445 and cells determined to be in the disturbed condition based on the read of adjacent WL(N+1) cells have their corresponding bit lines precharged to the adjusted precharge bit line voltage 447. Using a single strobe with a particular read reference voltage and sensing period can reduce the time required to read data from the selected WL(N) cells.

As described above, the particular adjusted precharge bit line voltage used to read WL(N) memory cells determined to be in a disturbed condition based on a performed read operation on adjacent WL(N+1), can depend on the determined WL(N+1) data, e.g., the particular data state of the adjacent WL(N+1) cell and/or Vt level shift amount associated with the programming thereof. That is, the precharge bit line voltage used to read WL(N) cells determined to be in an undisturbed condition and the adjusted precharge bit line voltage used to read WL(N) cells determined to be in a disturbed condition are not limited to the examples shown in FIGS. 4A-4D.

Figure 4D:
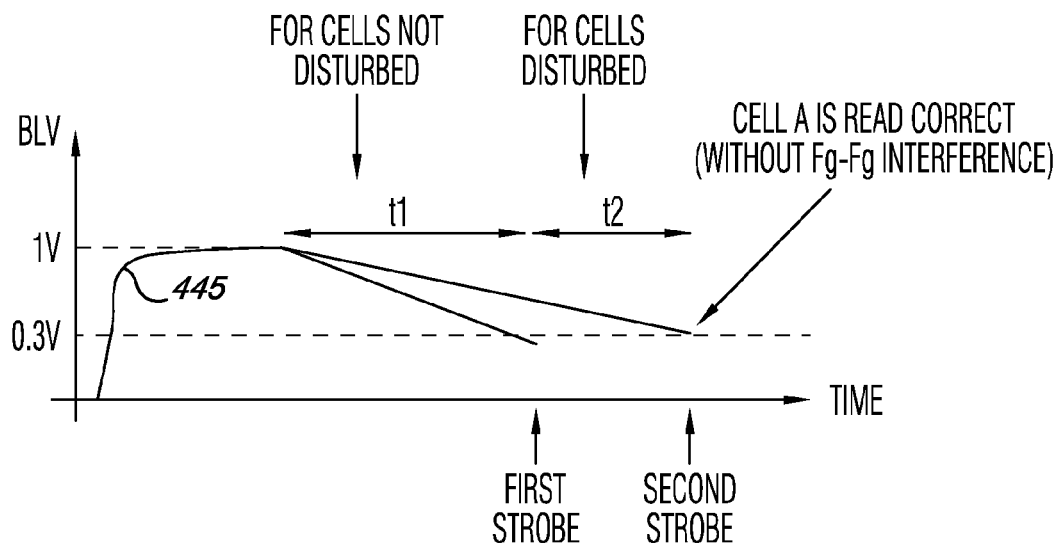
FIG. 4D illustrates a graph associated with reading data from memory cells by using an adjusted sensing parameter based on a read of adjacent memory cells according to another embodiment of the present disclosure

FIG. 4D illustrates a graph associated with reading data from memory cells by using an adjusted sensing parameter based on a read of adjacent memory cells according to another embodiment of the present disclosure. The graph shown in the embodiment of FIG. 4D illustrates a first sensing period t1 used to read memory cell 442-2 shown in FIGS. 4A and 4B, e.g., a memory cell on a selected word line such as WL(N) programmed to data state 441 and determined to be in an undisturbed condition based on a read operation performed on an adjacent cell of word line WL(N+1). The graph shown in the embodiment of FIG. 4D also illustrates a different sensing period t1+t2, e.g., an adjusted bit line sensing period, used to read memory cell 442-1 shown in FIGS. 4A and 4B, e.g., a memory cell on selected word WL(N) programmed to data state 441 and determined to be in a disturbed condition based on a read operation performed on the adjacent cell of word line WL(N+1). In various embodiments, sensing period t1 is about 5 microseconds and sensing period t2 is about 2 microseconds. However, the sensing periods t1 and t2 can depend on various factors such as a determined data state of the adjacent WL(N+1) cell among other factors, and embodiments of the present disclosure are not limited to a particular time value for sensing period t1 and/or t2.

The graph shown in the embodiment of FIG. 4D illustrates a method for reading data stored in memory cells, e.g., 442-1 and 442-2, that have been programmed to the same data state, e.g., 441, but may have experienced different Fg-Fg interference effects due to subsequent programming of adjacent memory cells. The method shown in FIG. 4D illustrates compensating for the Fg-Fg interference effects experienced by programmed cell A 442-1 such that both cell A 442-1, e.g., a disturbed cell, and cell 442-2, e.g., an undisturbed cell, are read correctly based on a particular applied reference read voltage, e.g., Vread as shown in FIGS. 4A and 4B. In the embodiment of FIG. 4D, an adjusted bit line sensing period t1+t2 is used to read disturbed cell 442-1 in order to compensate for the Vt shift amount experienced by cell 442-1 due to Fg-Fg interference caused by programming of an adjacent cell on an adjacent word line subsequent to cell 442-1 being programmed to data state 441.

In the embodiment of FIG. 4D, using adjusted sensing period t1+t2, e.g., 7 microseconds, results in sensing circuitry coupled to the corresponding bit line determining that cell 442-1 turned "off" in response to the application of Vread to word line WL(N), e.g., to the control gate of cell 442-1, during sensing period t1+t2. That is, in FIG. 4D, cell A 442-1 is determined to have a Vt level less than Vread, e.g., a Vt level corresponding to data state 441 shown in FIG. 4B, rather than being determined to have a Vt level greater than Vread, e.g., a Vt level corresponding to a data state other than 441, resulting in a read error as shown in FIG. 4B.

In the embodiment illustrated in FIG. 4D, two strobes can be used to read the disturbed cells, e.g., cell A 442-1, and the undisturbed cells, e.g., cell B 442-2, on a selected word line, e.g., WL(N). For instance, a first strobe using a particular read reference voltage, e.g., Vread, applied to the selected word line WL(N), and a particular bit line sensing period, e.g., t1, can be used to read the undisturbed cells programmed to a particular data state, e.g., 441 as shown in FIG. 4B. A second strobe using the same read reference voltage, e.g., Vread, applied to the selected word line WL(N), and a different particular sensing period, e.g., t1+t2, can be used to read the disturbed cells programmed to the particular data state, e.g., 441 as shown in FIG. 4B. During the first strobe and the second strobe, the WL(N) cells determined to be in the undisturbed condition based on a read of adjacent WL(N+1) cells have their corresponding bit lines precharged to the precharge bit line voltage 445 and the WL(N) cells determined to be in the disturbed condition based on the read of adjacent WL(N+1) cells have their corresponding bit lines precharged to the same precharge bit line voltage 445, e.g., 1.0V in this example.

As shown in FIG. 4D, performing a second strobe using the adjusted bit line sensing period t1+t2 to read disturbed cells, e.g., cell A 442-1, results in the corresponding bit line voltage discharging by an additional 300 mV. That is, as shown in FIG. 4B, cell the cell A bit line voltage discharges by 400 mV, e.g., from 1.0V to 0.6V, during sensing period t1. As shown in FIG. 4D, the increased sensing period t1+t2 causes the bit line voltage to discharge by an additional 300 mV during sensing time t2, e.g., from 600 mV to 300 mV. That is, during the adjusted sensing period t1+t2, the bit line voltage associated with the corresponding bit line discharges by more than the threshold amount, e.g., 500 mV in this example. As such, the adjusted sensing time t1+t2 associated with the second strobe results in Fg-Fg compensation, e.g., the WL(N) cells determined to be in a disturbed condition are read as not having been disturbed by Fg-Fg interference of the adjacent WL(N+1) cells.

In the embodiments illustrated in FIGS. 4A-4D, the cell adjacent to the target cell is assumed to share a bit line with the target cell, e.g., the adjacent cell and target cell are on neighboring word lines. However, embodiments are not limited to the examples shown in FIGS. 4A-4D. For instance, in various embodiments, the adjacent cell and target cell are coupled to neighboring bit lines and are on the same word line. In such embodiments, FIG. 4A can be considered to illustrate a graph associated with reading data from memory cells of a selected word line, e.g., odd bit line cells, prior to the cells experiencing floating gate to floating gate interference, e.g., prior to the cells' Vt levels experiencing a shift due to subsequent programming of neighboring cells of the selected word line, e.g., even bit line cells. In such embodiments, the odd bit line cells can be associated with an odd page of data and the even bit line cells can be associated with an even page of data. In various embodiments, cells coupled to even bit lines, e.g., cells associated with an even page, are programmed to a final state prior to cells coupled to odd bit lines, e.g., cells associated with an odd page, being programmed to a final state. However, embodiments are not so limited, e.g., odd bit line cells can be programmed to a final state prior to even bit line cells.

FIG. 5 is diagram of a portion of a memory array 500 including memory cells that can be read according to embodiments of the present disclosure. In the embodiment illustrated in FIG. 5 memory cells coupled to the even numbered bit lines, e.g., BL0, BL2, . . . , are represented by circles, and memory cells coupled to the odd numbered bit lines, e.g., BL1, BL3, . . . , are represented by squares. In various embodiments, the even bit line cells coupled to a selected word line are programmed and read together and the odd bit line cells coupled to a selected word line are programmed and read together. However, embodiments are not so limited, e.g., in various embodiments even and odd bit line cells can be read at the same time.

The embodiment shown in FIG. 5 includes target cells (TC) 536-1 and 536-3 corresponding to BL1 and BL3, respectively. The target cells 536-1 and 536-3 are programmed cells coupled to a selected word line, e.g., word line N. The target cells 536-1 and 536-3 can be read together as a portion of a logical page of data, e.g., PAGE(N), associated with word line N.

The embodiment shown in FIG. 5 also includes adjacent cells (AC) 530-1 and 530-3, which share bit lines with target cells 536-1 and 536-3, respectively, and can cause Fg-Fg interference effects on the target cells 536-1 and 536-3 due to subsequent programming. The cells 530-1 and 530-3 are coupled to a word line, e.g., word line N+1, adjacent to the selected word line N, and can be read together as a portion of a logical page of data, e.g., PAGE(N+1), associated with word line N+1.

In the embodiment illustrated in FIG. 5, the odd bit lines BL1 and BL3 are coupled to sensing module 552-1 and 552-3, respectively. The sensing modules 552-1 and 552-3 can include sensing circuitry, e.g., a sense amplifier among other circuitry (not shown), that can be used to precharge bit lines, e.g., BL1 and BL3, to various voltage levels and can sense discharges of the bit line voltage levels during data read operations. During read operations, the voltage level of the bit line decreases as current flows between source and drain depending on the reference read voltage applied to the selected word line. As described in FIGS. 4A-4D, the state of a cell being read can be determined based whether the bit line voltage discharges by a predetermined amount during a predetermined sensing period, or based on whether the bit line voltage reaches a predetermined threshold value during the predetermined sensing period.

Figure 7:
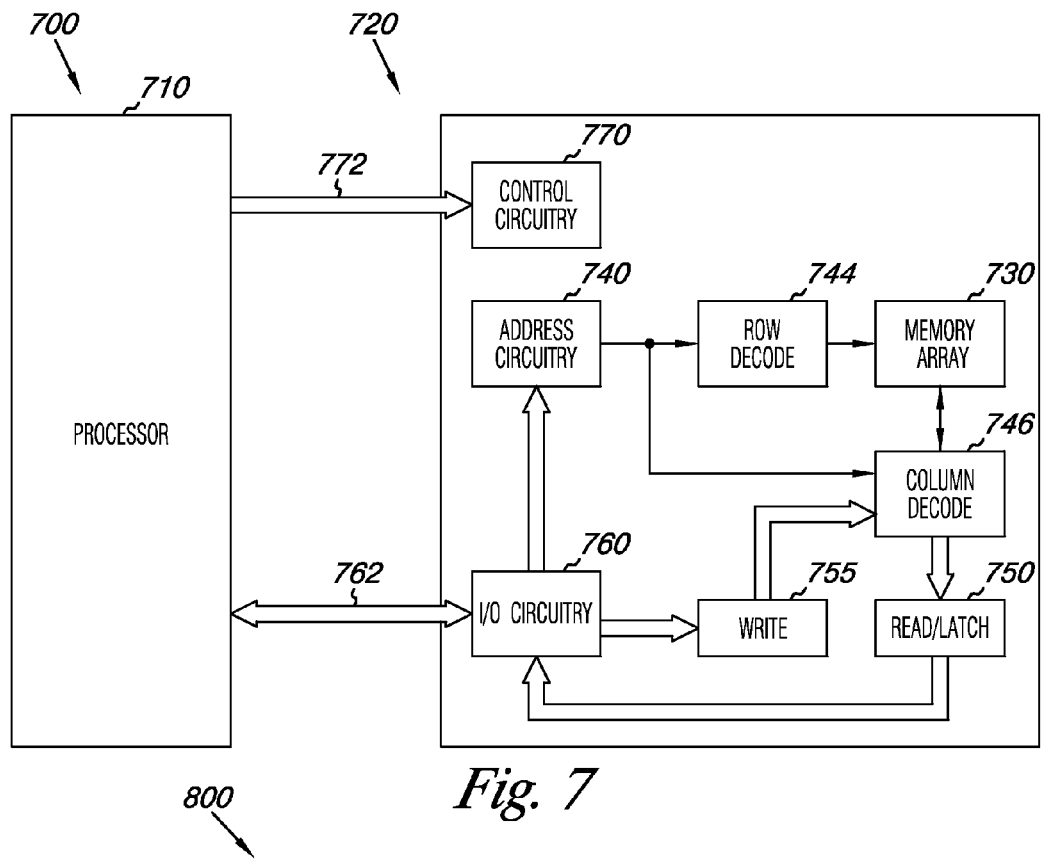
FIG. 7 is a functional block diagram of an electronic memory system having at least one memory device in accordance with an embodiment of the present disclosure.

As one of ordinary skill in the art will appreciate, the sense modules 552-1 and 552-3 can be coupled to control circuitry, e.g., control circuitry 770 shown in FIG. 7, which may include and/or be coupled to a controller and/or processor.

Although not shown in FIG. 5, the even bit lines, e.g., BL0 and BL2, can also be coupled to a sensing module. In some embodiments, alternate bit lines can share a sensing module. For instance, BL0 and BL1 can both be coupled to module 552-1 and BL2 and BL3 can both be coupled to module 552-3.

As shown in FIG. 5, the sensing modules 552-1 and 552-3 include respective data latches 556-1 and 556-3 and caches 554-1 and 554-3. The data latches 556-1 and 556-3 can store a disturb status indicator based on a read operation performed on the adjacent cells 530-1 and 530-3. As described above in connection with FIGS. 4A-4D, the state of the data latches 530-1 and 530-3 can determine a sensing parameter used by the sensing modules 552-1 and 552-3 to read data from the target cells 536-1 and 536-3. For instance, in this embodiment, if latch 556-1 stores a "0," then the sensing module 552-1 will consider target cell 536-1 to be in a "undisturbed" condition and will use a first sensing parameter, e.g., an unadjusted precharge bit line voltage or unadjusted sensing period, to read the target cell 536-1. On the other hand, if latch 556-1 stores a "1," then the sensing module 552-1 will consider target cell 536-1 to be in a "disturbed" condition and will use a different sensing parameter, e.g., an adjusted precharge bit line voltage or adjusted sensing period, to read the target cell 536-1. The caches 554-1 and 554-3 can be used to store data read from memory cells coupled to bit lines BL1 and BL3, respectively.

As described herein above, in various embodiments of the present disclosure, based on a request to read data from target cells of a first word line, e.g., 536-1 and 536-3 of word line N, a read operation is first performed on the cells adjacent to the target cells, e.g., adjacent cells 530-1 and 530-3 of word line N+1. The read operation performed on adjacent cells 530-1 and 530-3 can be used to determine whether the target cells 536-1 and/or 536-3 will be in a disturbed condition due to Fg-Fg interference effects. The determination of whether the target cells 536-1 and 536-3 are disturbed can depend on the data state of the adjacent cells 530-1 and 530-3, respectively. A target cell, e.g., 536-1 and/or 536-3, considered to be in a disturbed condition, will have a higher Vt level due to Fg-Fg interference from an adjacent cell. Various embodiments of the present disclosure can compensate for the increased Vt level due to Fg-Fg interference, e.g., the disturbed cell can be read as though its Vt level is lower than its actual value, which can reduce or prevent a read of the disturbed cell producing an error.

Figure 6:
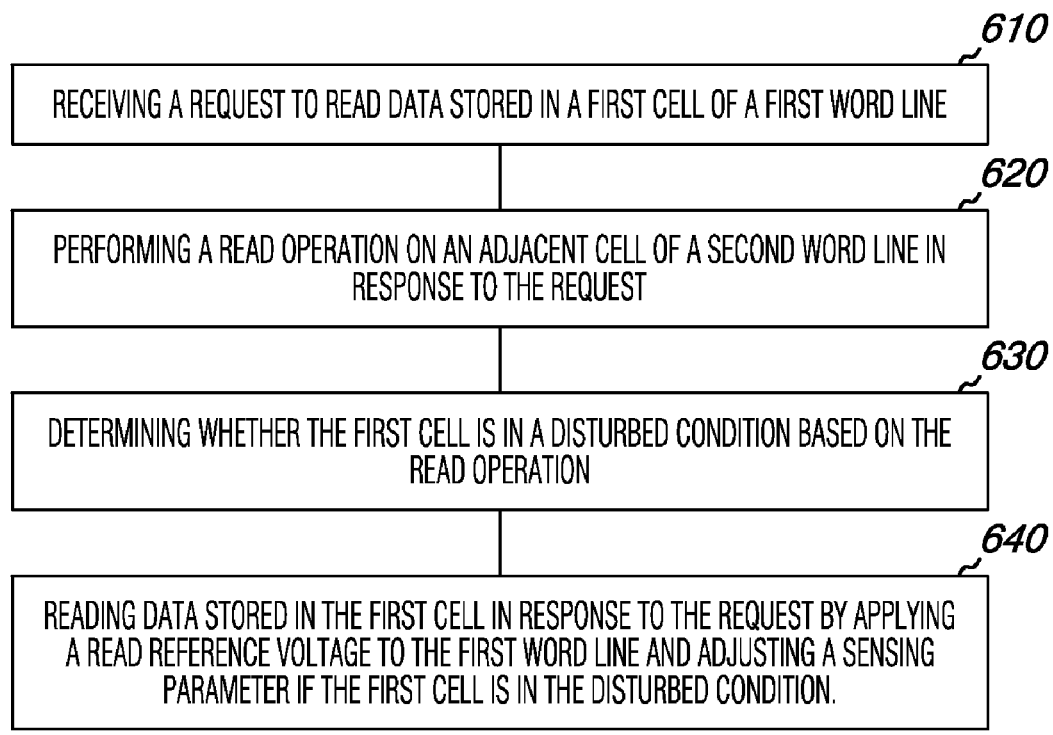
FIG. 6 is a block diagram of a method for reading non-volatile multilevel memory cells according to an embodiment of the present disclosure.

FIG. 6 is a block diagram of a method for reading non-volatile multilevel memory cells according to an embodiment of the present disclosure. At block 610, the method includes receiving a request to read data stored in a first cell of a first word line, e.g., a target cell of a selected word line WL(N).

At block 620, the method includes performing a read operation on an adjacent cell of a second word line, e.g., an adjacent word line WL(N+1), in response to the request. That is, in order to read data from a target cell of WL(N), a read operation is first performed on a cell adjacent to the target cell on WL(N+1), e.g., a cell on WL(N+1) sharing a bit line with the target cell on WL(N).

At block 630, the method includes determining whether the first cell, e.g., the target cell, is in a disturbed condition based on the read operation, e.g., based on the read operation performed on the WL(N+1) cell. In various embodiments, the method includes storing a disturb status indicator in a data latch associated with a bit line of the target cell and the adjacent cell based on the read operation. In some embodiments, the data latch can store a logic "1" to indicate that the WL(N+1) cell is in a state associated with Fg-Fg interference of the target cell on WL(N), and can store a logic "0" to indicate that the WL(N+1) cell is in a state not associated with Fg-Fg interference of the target cell on WL(N).

At block 640, the method includes reading data stored in the target cell in response to the request by applying a read reference voltage to the first word line WL(N) and adjusting a sensing parameter if the target cell is in the disturbed condition. In various embodiments, the method includes applying the same read reference voltage to word line WL(N) to read data stored in the target cell whether or not the target cell is in the disturbed condition.

In various embodiments, and as described in connection with FIGS. 4A-4C, adjusting the sensing parameter can include adjusting a precharge bit line voltage if the target cell of WL(N) is in the disturbed condition. In such embodiments, a first precharge bit line voltage can be used to read the target cell if the target cell is in an undisturbed condition.

In various embodiments, the determination of whether the target cell is in a disturbed condition is based on the actual data of the WL(N+1) cell. The method can include modifying the adjusted sensing parameter based on a determined data state of the adjacent cell, e.g., the WL(N+1) cell.

In various embodiments, and as described in connection with FIGS. 4A, 4B, and 4D, adjusting the sensing parameter can include adjusting a sensing period if the target cell of WL(N) is in the disturbed condition. In such embodiments, a first strobe with a first sensing period can be used to read the target cell if the target cell is in an undisturbed condition. A second strobe with a different, e.g., longer, sensing period can be used to read the target cell if the target cell is in a disturbed condition.

In various embodiments, performing the read operation on the adjacent cell includes applying only one read reference voltage to the word line WL(N+1). In some embodiments, the target cell is determined to be in an undisturbed condition if the read performed on the adjacent WL(N+1) cell results in a determination that the WL(N+1) cell is in the erase state. In such embodiments the target cell can be determined to be in a disturbed condition if the read performed on the adjacent WL(N+1) cell results in a determination that the WL(N+1) cell is not in the erase state., e.g., the Vt level of the WL(N+1) cell has shifted due to programming performed on the WL(N+1) cell subsequent to the target cell being programmed to a particular data state.

FIG. 7 is a functional block diagram of an electronic memory system having at least one memory device in accordance with an embodiment of the present disclosure. Memory system 700 includes a processor 710 coupled to a non-volatile memory device 720 that includes a memory array 730 of multilevel non-volatile cells. The memory system 700 can include separate integrated circuits or both the processor 710 and the memory device 720 can be on the same integrated circuit. The processor 710 can be a microprocessor or some other type of controlling circuitry such as an application-specific integrated circuit (ASIC).

For clarity, the electronic memory system 700 has been simplified to focus on features with particular relevance to the present disclosure. The memory device 720 includes an array of non-volatile memory cells 730, which can be floating gate flash memory cells with a NAND architecture. The control gates of each row of memory cells are coupled with a word line, while the drain regions of the memory cells are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 7 includes address circuitry 740 to latch address signals provided over I/O connections 762 through I/O circuitry 760. Address signals are received and decoded by a row decoder 744 and a column decoder 746 to access the memory array 730. In light of the present disclosure, it will be appreciated by those skilled in the art that the number of address input connections depends on the density and architecture of the memory array 730 and that the number of addresses increases with both increased numbers of memory cells and increased numbers of memory blocks and arrays.

The memory array 730 of non-volatile cells can include non-volatile multilevel memory cells read according to embodiments described herein. The memory device 720 reads data in the memory array 730 by sensing voltage and/or current changes in the memory array columns using sense/buffer circuitry that in this embodiment can be read/latch circuitry 750. The read/latch circuitry 750 can include a number of sensing modules, e.g., 552-1 and 552-3 shown in FIG. 5, and can read and latch a page or row of data from the memory array 730. I/O circuitry 760 is included for bi-directional data communication over the I/O connections 762 with the processor 710. Write circuitry 755 is included to write data to the memory array 730.

Control circuitry 770 decodes signals provided by control connections 772 from the processor 710. These signals can include chip signals, write enable signals, and address latch signals that are used to control the operations on the memory array 730, including data read, data write, and data erase operations. In various embodiments, the control circuitry 770 is responsible for executing instructions from the processor 710 to perform the operating and programming embodiments of the present disclosure. The control circuitry 770 can be a state machine, a sequencer, or some other type of controller. It will be appreciated by those skilled in the art that additional circuitry and control signals can be provided, and that the memory device detail of FIG. 7 has been reduced to facilitate ease of illustration.

Figure 8:
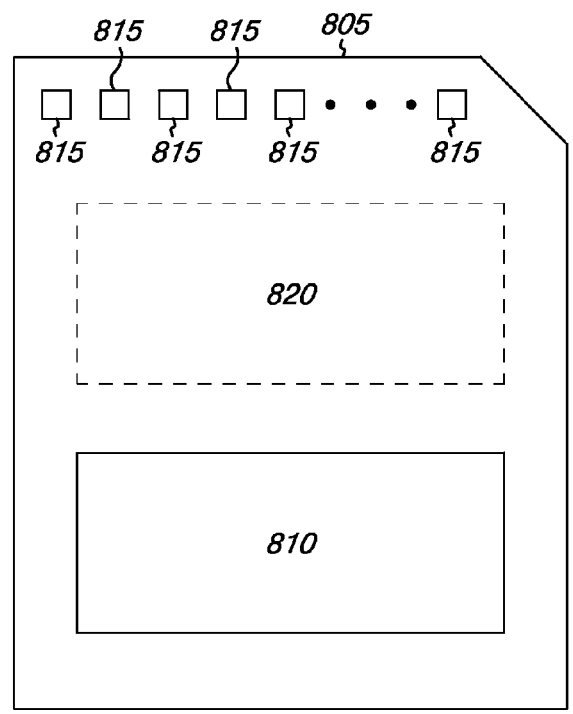
FIG. 8 is a functional block diagram of a memory module having at least one memory device in accordance with an embodiment of the present disclosure.

FIG. 8 is a functional block diagram of a memory module having at least one memory device in accordance with an embodiment of the present disclosure. Memory module 800 is illustrated as a memory card, although the concepts discussed with reference to memory module 800 are applicable to other types of removable or portable memory (e.g., USB flash drives) and are intended to be within the scope of "memory module" as used herein. In addition, although one example form factor is depicted in FIG. 8, these concepts are applicable to other form factors as well.

In some embodiments, memory module 800 will include a housing 805 (as depicted) to enclose one or more memory devices 810, though such a housing is not essential to all devices or device applications. At least one memory device 810 includes an array of non-volatile multilevel memory cells that can be read according to embodiments described herein. Where present, the housing 805 includes one or more contacts 815 for communication with a host device. Examples of host devices include digital cameras, digital recording and playback devices, PDAs, personal computers, memory card readers, interface hubs and the like. For some embodiments, the contacts 815 are in the form of a standardized interface. For example, with a USB flash drive, the contacts 815 might be in the form of a USB Type-A male connector. For some embodiments, the contacts 815 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 815 provide an interface for passing control, address and/or data signals between the memory module 800 and a host having compatible receptors for the contacts 815.

The memory module 800 may optionally include additional circuitry 820, which may be one or more integrated circuits and/or discrete components. For some embodiments, the additional circuitry 820 may include a memory controller for controlling access across multiple memory devices 810 and/or for providing a translation layer between an external host and a memory device 810. For example, there may not be a one-to-one correspondence between the number of contacts 815 and a number of 810 connections to the one or more memory devices 810. Thus, a memory controller could selectively couple an I/O connection (not shown in FIG. 8) of a memory device 810 to receive the appropriate signal at the appropriate I/O connection at the appropriate time or to provide the appropriate signal at the appropriate contact 815 at the appropriate time. Similarly, the communication protocol between a host and the memory module 800 may be different than what is required for access of a memory device 810. A memory controller could then translate the command sequences received from a host into the appropriate command sequences to achieve the desired access to the memory device 810. Such translation may further include changes in signal voltage levels in addition to command sequences.

The additional circuitry 820 may further include functionality unrelated to control of a memory device 810 such as logic functions as might be performed by an ASIC. Also, the additional circuitry 820 may include circuitry to restrict read or write access to the memory module 800, such as password protection, biometrics or the like. The additional circuitry 820 may include circuitry to indicate a status of the memory module 800. For example, the additional circuitry 820 may include functionality to determine whether power is being supplied to the memory module 800 and whether the memory module 800 is currently being accessed, and to display an indication of its status, such as a solid light while powered and a flashing light while being accessed. The additional circuitry 820 may further include passive devices, such as decoupling capacitors to help regulate power requirements within the memory module 800.

CONCLUSION

Methods, devices, modules, and systems for reading non-volatile multilevel memory cells have been shown. Various embodiments can compensate for threshold voltage (Vt) shifts of memory cells caused by floating gate to floating gate (Fg-Fg) interference effects in order to reduce or prevent read errors.

One method embodiment for reading memory cells in an array of non-volatile multilevel memory cells includes receiving a request to read data stored in a first cell of a first word line, performing a read operation on an adjacent cell of a second word line in response to the request, determining whether the first cell is in a disturbed condition based on the read operation. In various embodiments, determining whether the first cell is in a disturbed condition includes determining whether the Vt of the adjacent cell has increased since the programming of the first cell. The method includes reading data stored in the first cell in response to the read request by applying a read reference voltage to the first word line and adjusting a sensing parameter if the first cell is in the disturbed condition.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for reading memory cells in an array of non-volatile multilevel memory cells, the method comprising:
   receiving a request to read data stored in a first cell of a first word line;
   performing a read operation on an adjacent cell of a second word line in response to the request;
   determining whether the first cell is in a disturbed condition based on the read operation; and
   reading data stored in the first cell in response to the request by applying a read reference voltage to the first word line and adjusting a sensing parameter if the first cell is in the disturbed condition.

2. The method of claim 1, wherein adjusting the sensing parameter includes adjusting a precharge bit line voltage.

3. The method of claim 1, wherein the method includes modifying the adjusted sensing parameter based on a determined data state of the adjacent cell.

4. The method of claim 1, wherein the method includes applying the same read reference voltage to the first word line to read data stored in the first cell whether or not the first cell is in the disturbed condition.

5. The method of claim 1, wherein determining whether the first cell is in the disturbed condition includes determining if the adjacent cell is in an erase state.

6. The method of claim 1, wherein performing the read operation on the adjacent cell includes applying only one read reference voltage to the second word line.

7. The method of claim 1, wherein adjusting the sensing parameter includes adjusting a sensing time period.

8. The method of claim 1, wherein the method includes storing a disturb status indicator in a data latch associated with a bit line of the first cell and the adjacent cell based on the read operation.

9. A method for reading memory cells in an array of non-volatile multilevel memory cells, the method comprising:
   receiving a request to read data stored in a first cell of a word line;
   performing a read operation on a second cell of the word line in response to the request, wherein the second cell is adjacent to the first cell;
   determining whether the first cell is in a disturbed condition based on the read operation performed on the second cell;
   reading data stored in the first cell, based on the read operation performed on the second cell, by:
      using a first bit line sensing parameter to read the first cell if it is determined to be in an undisturbed condition; and
      using a different bit line sensing parameter to read the first cell if it is determined to be in the disturbed condition.

10. The method of claim 9, wherein using the first bit line sensing parameter includes using a particular precharge bit line voltage, and wherein the different bit line sensing parameter is a different precharge bit line voltage.

11. The method of claim 9, wherein determining whether the first cell is in the disturbed condition includes determining if the second cell is in an erase state.

12. The method of claim 9, wherein using the first bit line sensing parameter includes using a particular bit line sensing period, and wherein the different bit line sensing parameter is a different bit line sensing period.

13. The method of claim 9, wherein the method includes programming the first cell to a final program state prior to programming the second cell to a final program state.

14. A method for reading memory cells in an array of non-volatile multilevel memory cells, the method comprising:
   receiving a request to read data stored in a first cell of a first word line;
   performing a read operation on an adjacent cell of a second word line in response to the request;
   determining whether the first cell is in a disturbed condition based on the read operation; and
   reading data stored in the first cell in response to the request, wherein the reading includes:
      using a first precharge bit line voltage to read data stored in the first cell when the first cell is determined to be in an undisturbed condition; and
      using a different precharge bit line voltage to read data stored in the first cell when the first cell is determined to be in the disturbed condition.

15. The method of claim 14, wherein reading data stored in the first cell includes reading a page of data of a number of separately programmed pages of data associated with the first cell.

16. The method of claim 14, wherein the method includes performing the read operation on the adjacent cell to determine whether the adjacent cell is in an erase state.

17. The method of claim 14, wherein the memory cells have a number of read reference voltages corresponding with each of a number of data states, and wherein reading data stored in the first cell includes using the same read reference voltages when the first cell is determined to be in the disturbed condition and when the first cell is determined to be in the undisturbed condition.

18. The method of claim 14, wherein reading data stored in the first cell includes performing a single read of the first cell using a set of associated read reference voltages.

19. A method for reading memory cells in an array of non-volatile multilevel memory cells, the method comprising:
   receiving a request to read data stored in a first cell of a first word line;
   performing a read operation on an adjacent cell of a second word line in response to the request;
   determining whether the first cell is in a disturbed condition based on the read operation; and
   reading data stored in the first cell in response to the request, wherein the reading includes:

using a first bit line sensing period to read data stored in the first cell when the first cell is determined to be in an undisturbed condition; and using a different bit line sensing period to read data stored in the first cell when the first cell is determined to be in the disturbed condition.

20. The method of claim 19, wherein the method includes determining a data state of the adjacent cell based on the read operation, the adjacent cell capable of being programmed to multiple different data states representing multiple bits of data.

21. The method of claim 20, wherein the method includes adjusting the different bit line sensing period based on the determined data state of the adjacent cell.

22. The method of claim 21, wherein the method includes adjusting the first bit line sensing period based on the determined data state of the adjacent cell.

23. The method of claim 20, wherein the method includes:
associating a particular disturbed and a particular undisturbed bit line sensing period with each of the multiple different data states; and
determining which particular disturbed and undisturbed bit line sensing period to use for reading data stored in the first cell based on the determined data state of the adjacent cell.

24. The method of claim 19, wherein determining whether the first cell is in the disturbed condition based on the read operation includes checking a data latch coupled to a bit line shared by the first cell and the adjacent cell.

25. A non-volatile memory device comprising:
an array of non-volatile multilevel memory cells arranged in rows coupled by word lines and columns coupled by bit lines; and
control circuitry coupled to the array of memory cells and configured to execute a method for reading data from the memory cells, wherein the method includes:
receiving a request to read data from a first cell of a first word line;
performing a read operation on an adjacent cell of a second word line in response to the request;
determining whether the first cell is in a disturbed condition based on the read operation; and
reading data from the first cell in response to the request by:
applying a read reference voltage to the first word line;
using a particular sensing parameter if the first cell is determined to be in an undisturbed condition; and
using an adjusted sensing parameter if the first cell is determined to be in the disturbed condition.

26. The device of claim 25, wherein the device includes sensing circuitry coupled to a bit line corresponding to the first cell, the sensing circuitry configured to latch an indication of whether the first cell is in the disturbed condition based on the read operation.

27. The device of claim 26, wherein the adjusted sensing parameter is a different precharge bit line voltage.

28. The device of claim 25, wherein the particular sensing parameter is a precharge bit line voltage.

29. The device of claim 28, wherein the same read reference voltage is applied to the first word line when reading data from the first cell when the first cell is determined to be in the disturbed condition and when the first cell is determined to be in the undisturbed condition.

30. A non-volatile memory device comprising:
an array of non-volatile multilevel memory cells arranged in rows coupled by word lines and columns coupled by bit lines; and
control circuitry coupled to the array of memory cells and configured to execute a method for reading data from the memory cells, wherein the method includes:
receiving a request to read data from a first cell of a first word line;
performing a read operation on an adjacent cell of a second word line in response to the request;
determining whether the first cell is in a disturbed condition based on the read operation;
reading data from the first cell in response to the request by using a first precharge bit line voltage when the first cell is determined to be in an undisturbed condition; and
reading data from the first cell in response to the request by using a different precharge bit line voltage when the first cell is determined to be in the disturbed condition.

31. The device of claim 30, wherein the different precharge bit line voltage is less than the first precharge bit line voltage.

32. The device of claim 30, wherein the different precharge bit line voltage depends on a determined data state of the adjacent cell.

33. The device of claim 30, wherein the first memory cell is positioned closer to a common source line of the array than the adjacent memory cell.

34. A non-volatile memory device comprising:
an array of non-volatile multilevel memory cells arranged in rows coupled by word lines and columns coupled by bit lines; and
control circuitry coupled to the array of memory cells and configured to execute a method for reading data from the memory cells, wherein the method includes:
receiving a request to read data stored in a first cell of a first word line;
performing a read operation on an adjacent cell of a second word line in response to the request;
determining whether the first cell is in a disturbed condition based on the read operation; and
reading data from the first cell in response to the request, wherein the reading includes:
using a first bit line sensing period to read data from the first cell when the first cell is determined to be in an undisturbed condition; and
using a different bit line sensing period to read data from the first cell when the first cell is determined to be in the disturbed condition.

35. The device of claim 34, wherein the first bit line sensing period is longer than the different bit line sensing period.

36. The device of claim 35, wherein the first bit line sensing period is longer than the different bit sensing period by a predetermined amount.

37. The device of claim 35, wherein the first bit line sensing period corresponds to a first strobe of the first word line and the different bit line sensing period corresponds to a second strobe of the first word line associated with reading data from the first cell.

38. A non-volatile memory device comprising:
an array of non-volatile multilevel memory cells arranged in rows coupled by word lines and columns coupled by bit lines; and
control circuitry coupled to the array of memory cells and configured to execute a method for reading data from the memory cells, wherein the method includes:

receiving a request to read data from a first number of cells of a word line that are programmed together;

in response to the request, performing a read operation on a second number of cells of the word line that are programmed together and are adjacent to the first number of cells;

determining whether each of the first number of cells are in a disturbed condition based on the read operation performed on the second number of cells; and reading data stored in the first number of cells, in response to the request, by:

using a first bit line sensing parameter to read those of the first number of cells determined to be in an undisturbed condition; and using a different bit line sensing parameter to read those of the first number of cells determined to be in the disturbed condition.

39. The device of claim 38, wherein the first number of cells and the second number of cells are coupled to alternate even and odd bit lines.

40. The device of claim 38, wherein the method includes programming upper pages associated with the first number of cells prior to programming upper pages associated with the second number of cells.

41. The device of claim 38, wherein the first bit line sensing parameter is a particular precharge bit line voltage and the different bit line sensing parameter is a different precharge bit line voltage.

42. The device of claim 41, wherein the particular precharge bit line voltage is at least 1.0 volts and the different precharge bit line voltage is no more than 0.7 volts.

43. The device of claim 38, wherein the method includes storing a disturb status indicator in a data latch associated with a bit line of the first cell and the adjacent cell based on the read operation.

44. The device of claim 38, wherein the device includes sensing circuitry coupled to bit lines corresponding to the first number of cells and the second number of cells, the sensing circuitry configured to store a disturb status indicator corresponding to each of the first number of cells.

45. The device of claim 44, wherein the disturb status indicator corresponding to each of the first number of cells is stored in a data latch shared by one of the first number of cells and an adjacent one of the second number of cells.

* * * * *

UNITED STATES PATENT AND TRADEMARK OFFICE
CERTIFICATE OF CORRECTION

PATENT NO. : 7,684,237 B2 Page 1 of 1
APPLICATION NO. : 12/038704
DATED : March 23, 2010
INVENTOR(S) : Violante Moschiano et al.

It is certified that error appears in the above-identified patent and that said Letters Patent is hereby corrected as shown below:

In column 1, lines 4-8, delete

"TECHNICAL FIELD
This application claims priority to Italian Patent Application Serial No. RM2007A000273, filed May 16, 2007, the specification of which is incorporated herein by reference
The present disclosure relates generally to semiconductor devices and, more particularly, to memory devices having non-volatile multilevel memory cells."
and insert
-- CROSS-REFERENCE TO RELATED APPLICATIONS
This application claims priority to Italian Patent Application Serial No. RM2007A000273, filed May 16, 2007, the specification of which is incorporated herein by reference.

TECHNICAL FIELD
The present disclosure relates generally to semiconductor devices and, more particularly, to memory devices having non-volatile multilevel memory cells. --, therefor.

Signed and Sealed this

First Day of June, 2010

David J. Kappos
*Director of the United States Patent and Trademark Office*